United States Patent
Jiang et al.

(10) Patent No.: US 9,624,093 B2
(45) Date of Patent: Apr. 18, 2017

(54) METHOD AND APPARATUS OF MAKING MEMS PACKAGES

(71) Applicant: Apple Inc., Cupertino, CA (US)

(72) Inventors: Tongbi Jiang, Santa Clara, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/543,468

(22) Filed: Nov. 17, 2014

(65) Prior Publication Data

US 2016/0137488 A1    May 19, 2016

(51) Int. Cl.
*B81B 7/00*    (2006.01)
*B81C 1/00*    (2006.01)

(52) U.S. Cl.
CPC ........ *B81B 7/0048* (2013.01); *B81C 1/00325* (2013.01); *B81C 2203/0154* (2013.01)

(58) Field of Classification Search
CPC .............. B81B 7/0048; B81C 1/00325; B81C 2203/0154
See application file for complete search history.

(56) References Cited

U.S. PATENT DOCUMENTS

| | | | |
|---|---|---|---|
| 7,192,870 B2* | 3/2007 | Shibata ............... | B05B 15/1218 257/706 |
| 8,890,265 B2* | 11/2014 | Kuratani ............... | H01L 23/552 257/416 |
| 2008/0134777 A1 | 6/2008 | Maatuk | |
| 2013/0050227 A1 | 2/2013 | Petersen et al. | |
| 2014/0044297 A1 | 2/2014 | Loeppert et al. | |
| 2014/0268300 A1 | 9/2014 | Ishii | |

* cited by examiner

*Primary Examiner* — Long Pham
(74) *Attorney, Agent, or Firm* — Blakely, Sokoloff, Taylor & Zafman LLP

(57) ABSTRACT

MEMS packages and modules are described. In an embodiment, a module includes a package mounted within an opening in a module board. The package includes a flexible wiring board mounted to a back surface of the module board and spanning across the opening in the module board. A die is mounted on the flexible wiring board and is encapsulated within an overmold. An air gap exists laterally between the overmold and side surface of the opening in the module board.

20 Claims, 9 Drawing Sheets

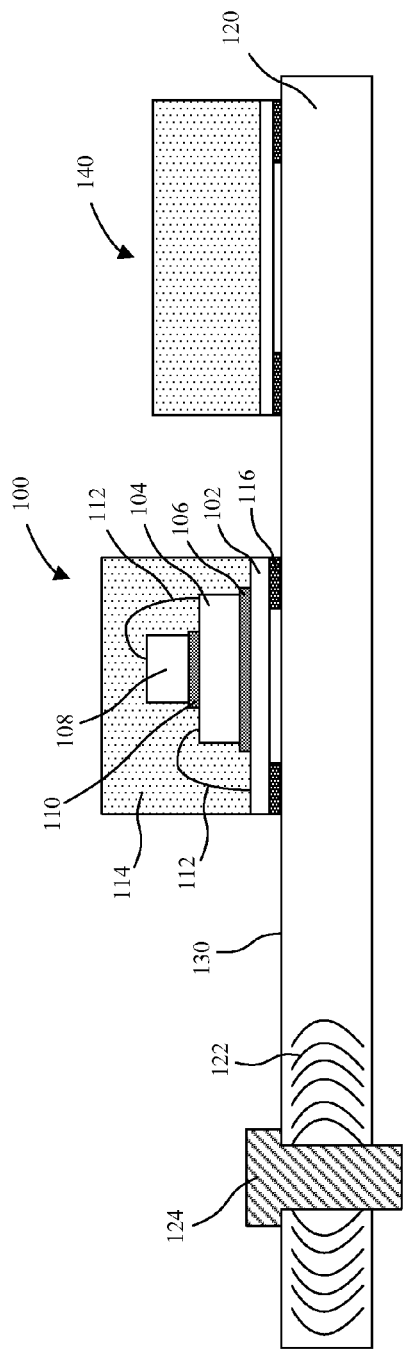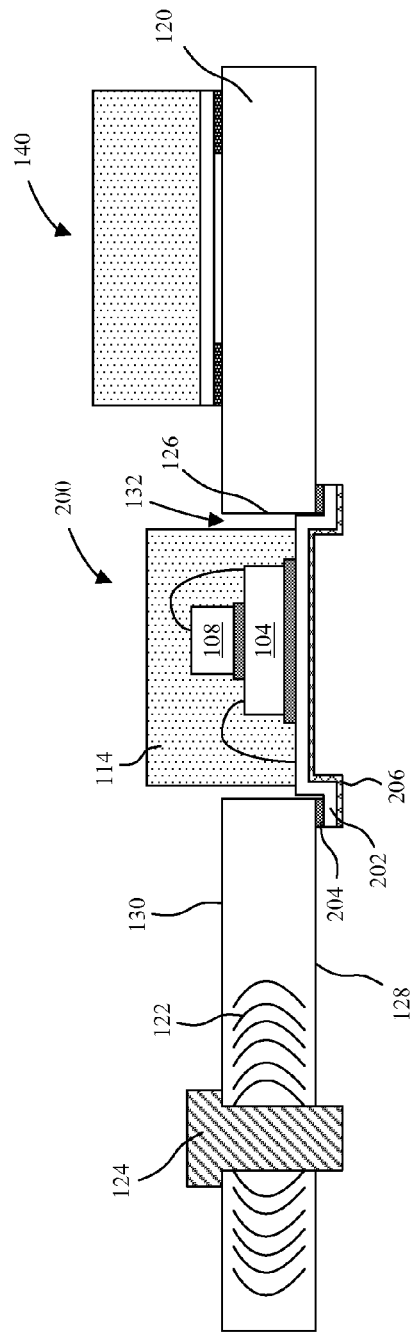

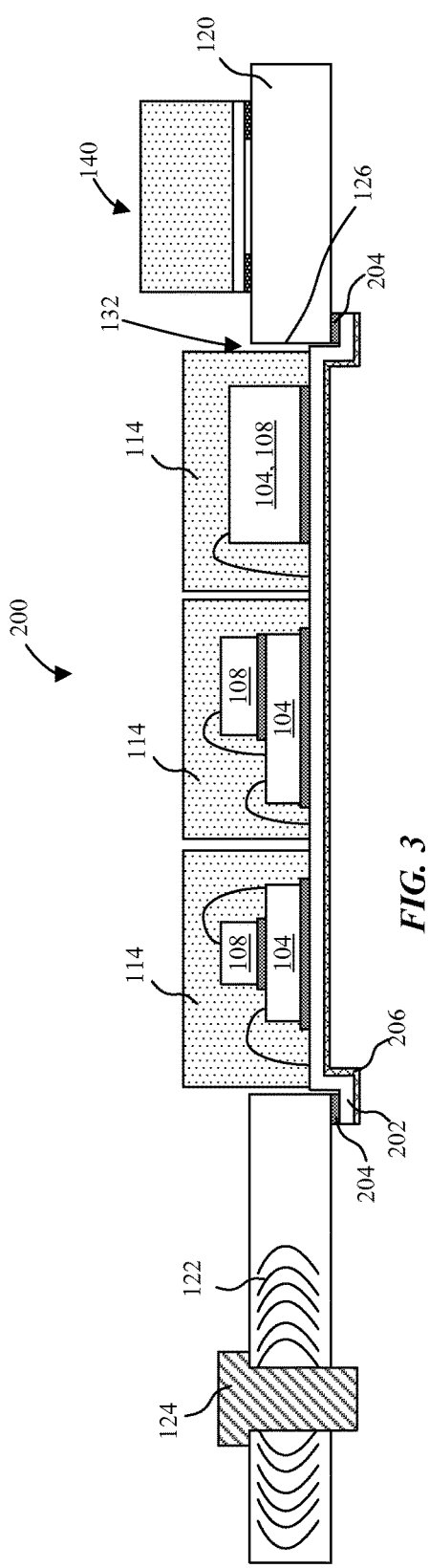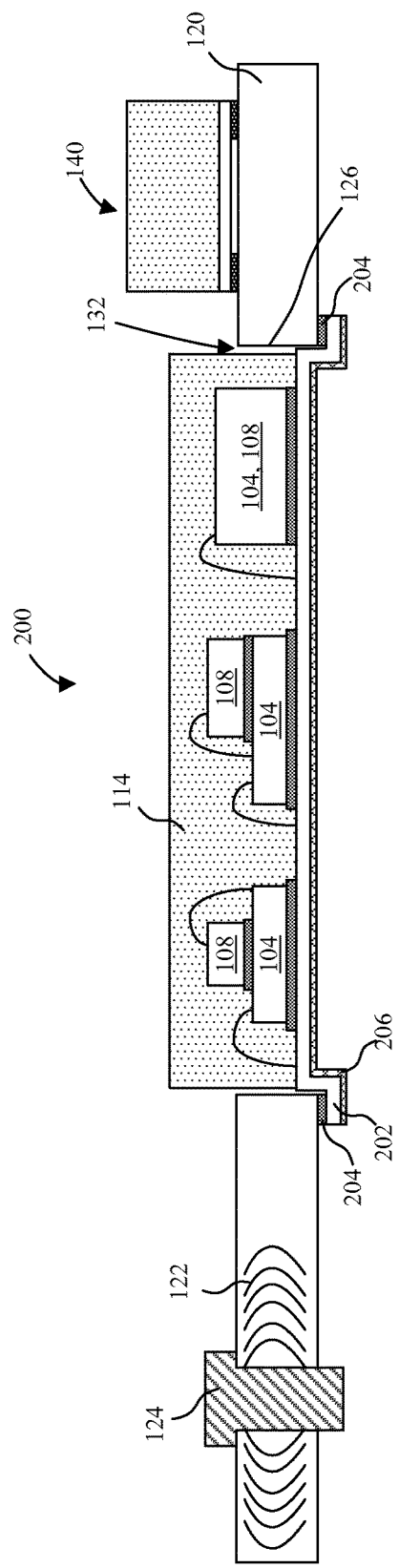

METHOD AND APPARATUS OF MAKING MEMS PACKAGES

BACKGROUND

Field

Embodiments described herein relate to MEMS packaging.

Background Information

Micro-electro-mechanical systems (MEMS) die can be formed from customized integrated circuits. MEMS are often used to sense environmental characteristics or act as a user input for electronic products. MEMS, unlike some general purpose integrated circuits, can have unique packaging and mounting requirements since MEMS often require exposure to an ambient external environment, such as an ambient environment of a user using the electronic product having the sensor. MEMS have become a significant growth area in consumer space. Gyrometers, accelerometers, microphones, pressure sensors, and magnetometers are all sensitive to strain induced performance drift. As consumer MEMS packages and modules continue to see footprint and profile reduction, price reduction, and higher level of integration, it becomes more difficult to manage strain induced drift. In addition, stress impact to MEMS output change may become more serious when package thickness and form factor are further reduced to meet market needs.

SUMMARY

In an embodiment, a module includes a package mounted within an opening in a module board. The package may be a flexible package. For example, the package can include a flexible wiring board mounted to a back surface of the module board and spanning across the opening in the module board. A die is mounted on the flexible wiring board and is encapsulated within an overmold. An air gap exists laterally between the overmold and side surface of the opening in the module board. In an embodiment, the overmold is formed directly on the flexible wiring board. In an embodiment, the die is at least partially contained inside the opening. In an embodiment, the die is a MEMS die, and the package is a MEMS package. Additional die or die stacks may be mounted on the flexible wiring board adjacent the MEMS die. For example, the additional die or die stacks may be encapsulated within the same overmold as the MEMS die, or separate overmolds.

A stiffener layer may be bonded to a back side of the flexible wiring board opposite the MEMS die. The stiffener layer may be more flexible than the module board so that the stiffener layer provides an amount of structural support. In an embodiment, the stiffener layer is partially contained within the opening in the wiring board.

The MEMS package may include a variety of die configurations. For example, the die may include a MEMS die and IC die. Each of the die may additionally be bonded to an underlying substrate with a die attach film including an elastomeric material. For example, a MEMS die may be bonded to an IC die with a die attach film, and the IC die may in turn be bonded to the flexible wiring board with a die attach film. Wire bonding may be used to provide electrical connections to the MEMS die and IC die.

Additional packages may be surface mounted onto the front or back surfaces of the wiring board. In an embodiment, profile heights of the other packages are raised above the profile height of the package including the MEMS die.

In an embodiment, a method of forming a module includes forming an opening through a module board, and laminating a flexible wiring board of a MEMS package onto a back surface of the module board such that an air gap exists laterally between an overmold encapsulating the die on the flexible wiring board and side surfaces of the opening in the module board. Laminating may include attaching the flexible wiring board to the back surface of the module board with a z-axis film. The z-axis film may be laminated on the module board or the flexible wiring board.

BRIEF DESCRIPTION OF THE DRAWINGS

FIG. 1 is a cross-sectional side view illustration of a MEMS package surface mounted onto a module board.

FIGS. 2A-2C are cross-sectional side view illustrations of a MEMS package mounted in an opening of a module board in accordance with embodiments.

FIGS. 3-4 are cross-sectional side view illustrations of a MEMS package including multiple die mounted in an opening of a module board in accordance with embodiments.

DETAILED DESCRIPTION

Figure 2B:
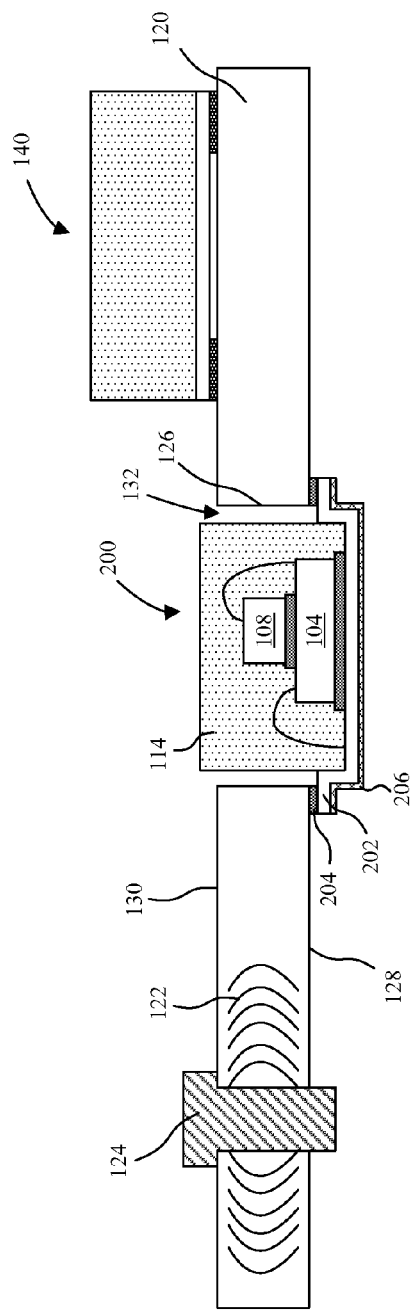

Embodiments describe MEMS packages, modules, and methods of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe MEMS packages, modules and manners of fabrication which may address MEMS device stress and strain induced performance drift, particularly for high sensitivity applications. For example, thermo-mechanical stress from a MEMS package or underlying module board can cause MEMS device output shift, particularly as temperature changes. In an embodiment, a MEMS package is molded onto a flexible wiring board, also commonly known as a flexible printed circuit board or flex circuit. The flexible wiring board is mounted on a module board such that the MEMS package is at least partially contained inside an opening in the module board. The module board may be a rigid substrate, such as a rigid printed circuit board (PCB). In this manner, in plane strain from the module board may be diverted away from the MEMS die by the flexible wiring board. Thus, stress propagation from the module board to the MEMS die may be reduced, such as mechanical stress from screws, bending, twisting, stress from other high strain components on the module board, or hygroscopic stress from the module board. In another aspect, the flexible wiring board may enable better shock and drop performance of the device incorporating the MEMS module. In another aspect, the recessed MEMS package design may enable reduced overall module thickness. In yet another aspect, the recessed MEMS package design may allow for an increased MEMS die or package thickness for increased immunity to strain.

Referring now to FIG. 1 a cross-sectional side view illustration is provided of a MEMS package surface mounted onto a module board. As illustrated, the exemplary MEMS package 100 includes a surface mount substrate 102, an integrated circuit (IC) die 104, such as an application specific integrated circuit (ASIC) die, attached to the surface mount substrate 102 with a die attach film 106, and a MEMS die 108 attached to the IC die 104 with a die attach film 110. Wire bonds 112 are used to provide electrical connection between the MEMS die 108, IC die 104, and surface mount substrate 102. An overmold 114 of a molding compound encapsulates the die and wire bonds on the surface mount substrate 102.

As shown in FIG. 1, a module substrate 120 may be a rigid PCB for example. MEMS package 100 is mounted onto a front surface 130 (or back surface 128) the module substrate 120 with conductive bumps 116, such as solder bumps. Module substrate 120 may have one or more additional packages 140 mounted on the front surface 130 or back surface 128. It has been observed that MEMS package 100 may be sensitive to stress 122 from the module substrate 120. For example, stress can be attributed to the module substrate 120 material properties, thickness, and metal layout. For example, this stress can be transferred to the MEMS package 100 from screws 124 or other high stress packages 140 mounted on the module substrate, mechanical bending stress from thermal expansion mismatch of substrates or components, and hygroscopic stress associated with moisture ingression. When the MEMS package 100 is rigidly mounted onto the module substrate 120, as illustrated in FIG. 1, these stresses can be directly transferred to the MEMS package, resulting in strain induced performance drift.

Still referring to FIG. 1, the profile height of the MEMS package 100 is illustrated as being greater than a profile height of the other packages 140 on the same surface of the module board 120. This height difference may also be attributed to mitigating strain induced performance drift of the MEMS die 108, with a thicker MEMS die 108 being less sensitive to strain. Thus, as consumer devices, particularly mobile and wearable devices, continue to become thinner with increased functionality, further reduction in MEMS die 108 and MEMS package 100 thickness may be met with a tradeoff of increased strain induced performance drift.

Referring now to FIG. 2A, in accordance with embodiments described herein a MEMS package 200 including a flexible wiring board 202 is mounted on a back surface 128 of the module board 120 spanning across an opening 126 in the module board 120 (see also FIGS. 11-14). As shown, the opening 126 extends through and is laterally surrounded by the module board 120. A die is mounted on the flexible wiring board and at least partially contained inside the opening. The die is encapsulated within an overmold 114 and an air gap 132 exists laterally between the overmold 114 and side surfaces of the opening 126 in the module board. In an embodiment, the flexible wiring board 202 is mounted to the back surface 128 of the module board 120 with a z-axis film 204. A z-axis film is a film with anisotropic electrical conductivity. For example, the film includes an adhesive material (e.g. epoxy/acrylate blend) filled with conductive particles enabling electrical interconnection through a thickness of the film (the z-axis) between substrates. A stiffener layer 206 may optionally be bonded to the backside of the flexible wiring board 202 to mechanically secure the die within the opening 126 in the module board 120. For example, the stiffener layer 206 may be formed of a material such as polyimide, or stainless steel. In an embodiment, the stiffener layer 206 is more flexible than the module board 120. For example, this may be obtained by modulation of thickness and material. In the embodiment illustrated in FIG. 2A, the flexible wiring board 202 and optional stiffener layer 206 are bent toward the opening 126 so that they are at least partially contained within the opening.

In one aspect, embodiments describe a MEMS module configuration including a flexible MEMS package which mitigates in plane strain propagation from the module board 120 to the MEMS package 200. Integration of a flexible MEMS package into a recessed module board design, creates a physical discontinuity in the module board allowing for mitigation of in-plane related strain propagation from the module board to the MEMS die, as well as the transfer of external stress resulting from shock and drop of the electronic device into which the MEMS module is integrated.

In another aspect, embodiments describe a MEMS module configuration in which a flexible MEMS package is coupled to the module board 120 such that motion including acceleration and rotation of the MEMS package and module board are coupled. A stiffener layer may additionally be bonded to the flexible MEMS package to allow x/y/z motion and rotation sensing that is in sync with the module board, and overall system.

In another aspect, embodiments describe a MEMS module configuration in which a recessed module board design may allow for MEMS package profile height, and therefore MEMS die 108 thickness, to be maintained or increased. In a typical fabrication process, MEMS die are often thinned during fabrication in order to meet packaging specifications. In an embodiment, a total module thickness of the module board and attached components (e.g. surface mounted packages) may be reduced while MEMS package 200 and MEMS die 108 thickness may be maintained or increased for improved MEMS die 108 performance and reduced strain induced performance drift. Thus, embodiments may enable continued reduction in footprint and profile of a MEMS module, and increased functionality in a given footprint on the module board 120, without requiring further reduction in MEMS package 200 and MEMS die 108 thickness.

In the particular embodiment illustrated in FIG. 2A, a die stack arrangement is illustrated as similar to that in FIG. 1. Specifically, the die stack arrangement includes an IC die 104 attached to a flexible wiring board 202 with a die attach film 106, and a MEMS die 108 attached to the IC die 104 with a die attach film 110. Wire bonds 112 are used to provide electrical connection between the MEMS die 108, IC die 104, and flexible wiring board 202. An overmold 114 of a molding compound encapsulates the die and wire bonds on the flexible wiring board 202. In an embodiment, the MEMS die 108 is not attached to the flexible wiring board 202 with a rigid solder bond. For example, in the embodiment illustrated in FIG. 2A, the MEMS die 108 is attached to the IC die 104 with die attach film 110, and the IC die 104 in turn is attached to the flexible wiring board 202 with a die attach film 106. Die attach films 110, 106 may be formed of an elastomeric material, such as silicone, which can be characterized as a high flexibility and low stress adhesive material employed in packaging. Overmold 114 may be formed directly on the flexible wiring board 202. In the embodiment illustrated in FIG. 2A, both the MEMS die 108 and IC die 104 are at least partially contained within the opening 126. In an embodiment, either or both of the MEMS die 108 and IC die 104 are completely contained within the opening 126. In the embodiment illustrated in FIG. 2A, a profile height of the MEMS package 200 (e.g. top surface of the overmold 114) is raised above the front surface 130 of the module board 120.

It is to be appreciated that the particular die stack arrangement provided in FIG. 2A is exemplary, and that embodiments are compatible with a variety of alternative MEMS die 108 arrangements that include MEMS die 108 encapsulated on a flexible wiring board 202 with an overmold 114 of a molding compound. For example, a MEMS die 108 or IC die 104 can be mounted directly on the flexible wiring board 202 with a die attach film.

Figure 2C:
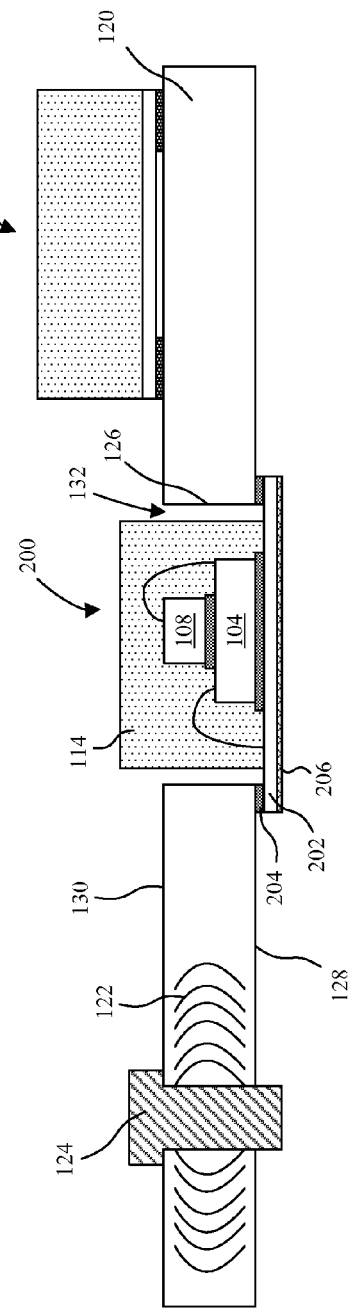

Referring now to FIGS. 2B-2C, a MEMS package 200 including a flexible wiring board 202 is mounted on a back surface 128 of the module board 120 spanning across an opening 126 in the module board 120 in accordance with embodiments. FIG. 2B is similar to the embodiment illustrated in FIG. 2A, with one difference being that the flexible wiring board 202 and optional stiffener layer 206 are bent away from the opening 126, such that they are not contained within the opening 126. In an embodiment, a bent flexible wiring board 202 and optional stiffener layer 206 may allow for additional decoupling of in plane strain from the mounting board 120 such that when the mounting board is stretched, the flexible wiring board 202 and optional stiffener layer 206 in turn may bend, rather than stretch. FIG. 2C is similar to the embodiment illustrated in FIG. 2A, with one difference being that the flexible wiring board 202 and optional stiffener layer 206 are not bent, and are flat across the opening 126.

Figure 2D:
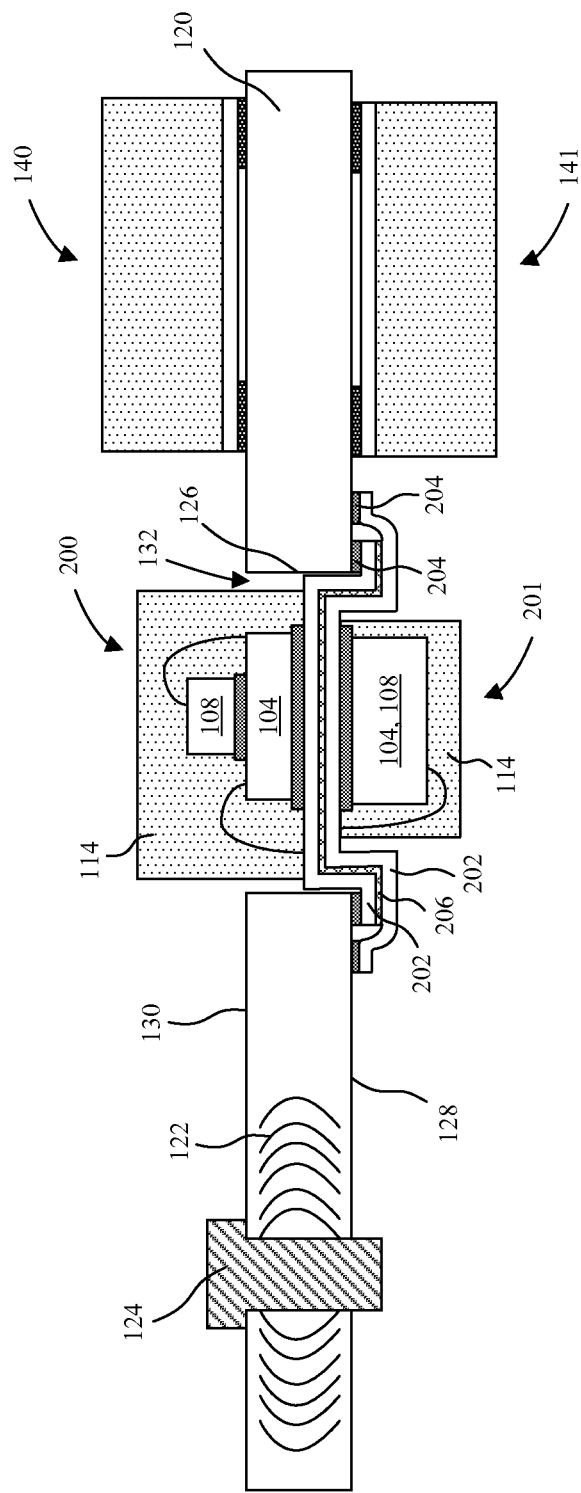
FIG. 2D is a cross-sectional side view illustration of front and back MEMS packages mounted in an opening of a module board in accordance with an embodiment.

FIG. 2D is a cross-sectional side view illustration of front and back MEMS packages mounted in an opening in a module board in accordance with an embodiment. As illustrated in FIGS. 2A-2C, the location of a flexible MEMS package within the opening in the mounting board 120 can be adjusted to achieve different profile heights (or elevations) of the MEMS packages 200, 201 relative to other packages 140, 141 mounted on the module board 120. In the embodiment illustrated in FIG. 2D, a second flexible package 201 is mounted on a back surface of the stiffener layer 206 where the stiffener layer is secured in the opening 126. Flexible package 201 may be a single die or multiple die stack, similar to MEMS package 200. Furthermore, additional packages 141 may be mounted on the back surface 128 of the module board 120. In an embodiment, flexible package 201 is thicker than package 141, yet it is not elevated beyond the bottom height of package 141 due to being recessed within the opening 126. In the embodiment, illustrated in FIG. 2D, flexible package 201 includes a MED die 104 or IC die 108, though this is meant to be exemplary, and other die or die stack configurations are contemplated.

FIGS. 3-4 are cross-sectional side view illustrations of MEMS packages 200 including multiple die connected to a flexible wiring board mounted across an opening in a module board in accordance with embodiments. In such configurations, a group of strain sensitive components can be mounted within the opening 126 of the module board 120. In the embodiment illustrated in FIG. 3, multiple die or die stacks are arranged side-by-side on the flexible wiring board 202, with each laterally separate die or die stack encapsulated in a separate overmold 114 on the flexible wiring board 202. For example, such a configuration may be suitable where each laterally separate die or die stack is an individually tested component prior to molding. In the embodiment illustrated in FIG. 4, multiple die or die stacks are arranged side-by-side on the flexible wiring board 202, with each laterally separate die or die stack encapsulated in the same overmold 114. For example, such a configuration may be suitable where the laterally separate die or die stacks are a multifunctional component. In the embodiments illustrated in FIGS. 3-4, the multiple die or die stacks include multiple MEMS die 104 arranged side-by-side. As illustrated, an air gap 132 exists laterally between the overmold(s) 114 and side surfaces of the opening 126 in the module board.

Figure 5:
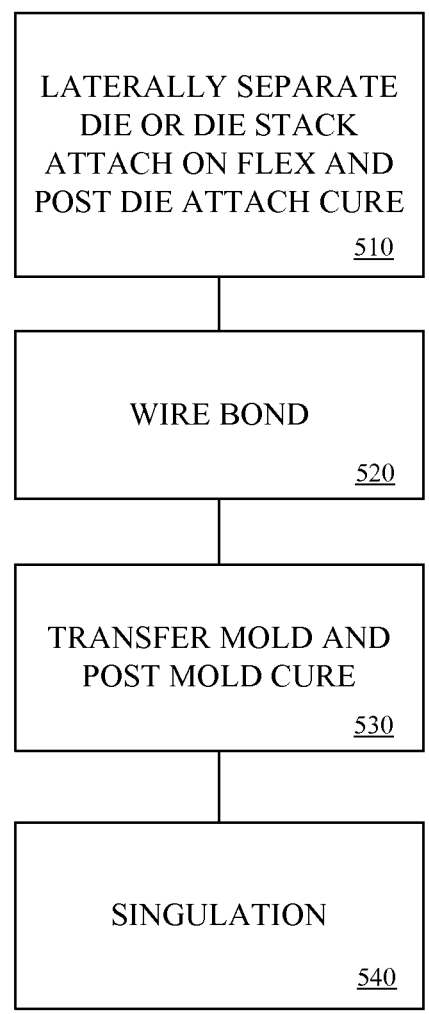
FIG. 5 is an illustration a first level package flow in accordance with an embodiment.
Figure 6:
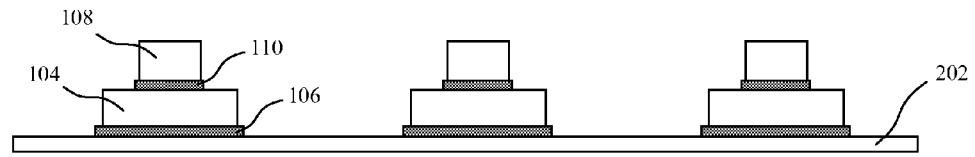
FIG. 6 is a cross-sectional side view illustration of stacked die attached to a flexible wiring board in accordance with an embodiment.
Figure 7:
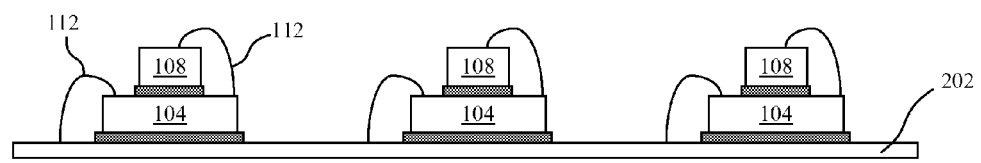
FIG. 7 is a cross-sectional side view illustration of wired bonded stacked die in accordance with an embodiment.
Figure 8:
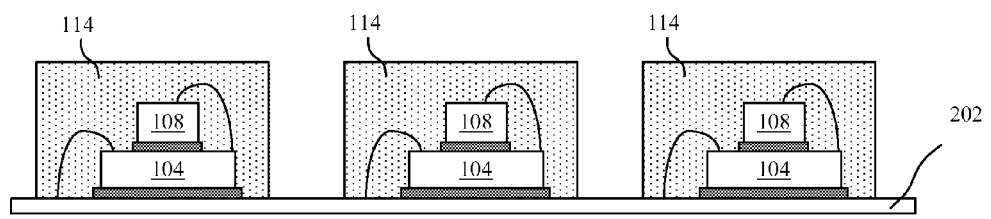
FIG. 8 is a cross-sectional side view illustration of molded stacked die in accordance with an embodiment.
Figure 9:
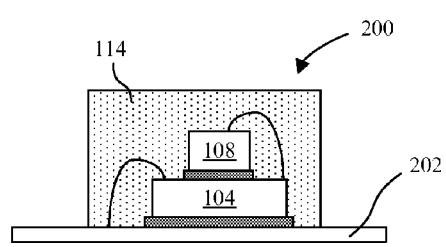
FIG. 9 is a cross-sectional side view illustration of a singulated MEMS package in accordance with an embodiment.

Referring now to FIG. 5 in combination with FIGS. 6-9 a first level package flow is provided in accordance with an embodiment. At operation 510 laterally separate die or die stacks are attached on a flexible wiring board 202 with a die attach film, followed by cure of the die attach film. In the particular embodiment illustrated in FIG. 6, die stacks including an IC die 104 and MEMS die 108 are attached with die attach films 106, 110 and cured. Following the die attach, the die are wire bonded at operation 520. In the exemplary embodiment illustrated in FIG. 7, wire bonds 112 are used to provide electrical connection of the MEMS die 108 to the IC die 104, and electrical connection of the IC die 104 to the flexible wiring board 202. This particular configuration is meant to be exemplary, and other wire bonding configurations are contemplated. At operation 530 the flexible wiring board 202 is molded and cured to form overmolds 114 over one or more die or die stacks as illustrated in FIG. 8. At operation 540 individual flexible MEMS packages 200 are singulated as illustrated in FIG. 9. While the process flow illustrated in FIGS. 6-9 is made with regard to a single stacked die arrangement, this process is exemplary, and may be used to form a variety of other MEMS package configurations including, but not limited to, those illustrated and described with regard to FIGS. 2A-4.

Figure 10:
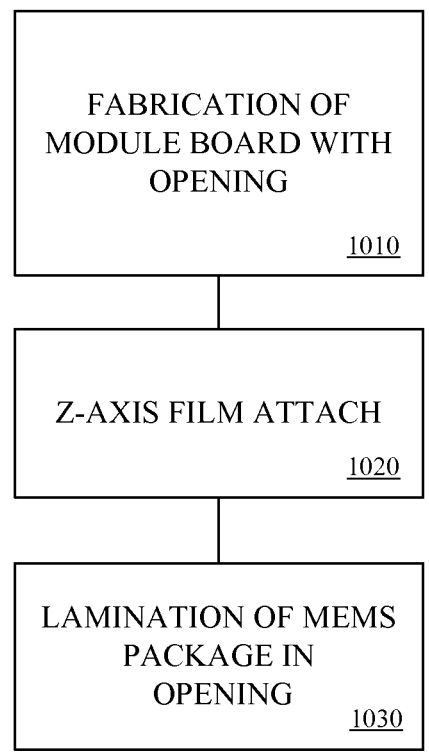
FIG. 10 is an illustration a second level package flow in accordance with an embodiment.
Figure 11:
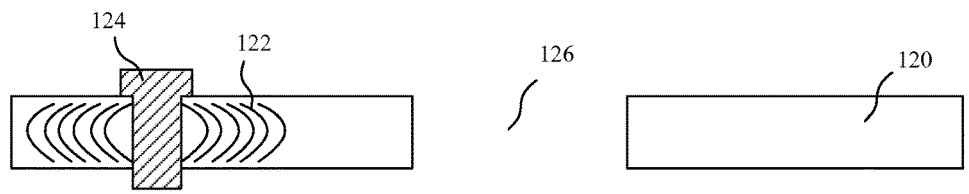
FIG. 11 is a cross-sectional side view illustration of an opening formed in a module board in accordance with an embodiment.
Figure 12:
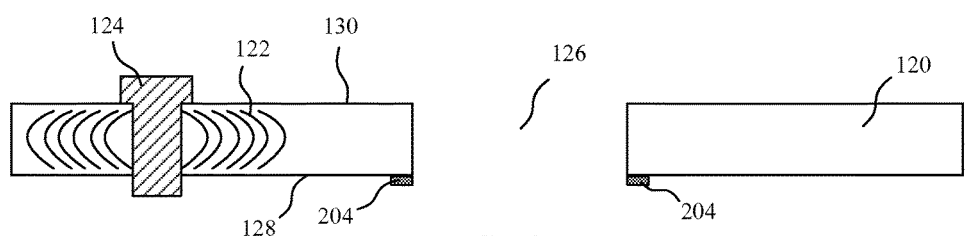
FIG. 12 is a cross-sectional side view illustration of a z-axis film attached to a module board in accordance with an embodiment.
Figure 13:
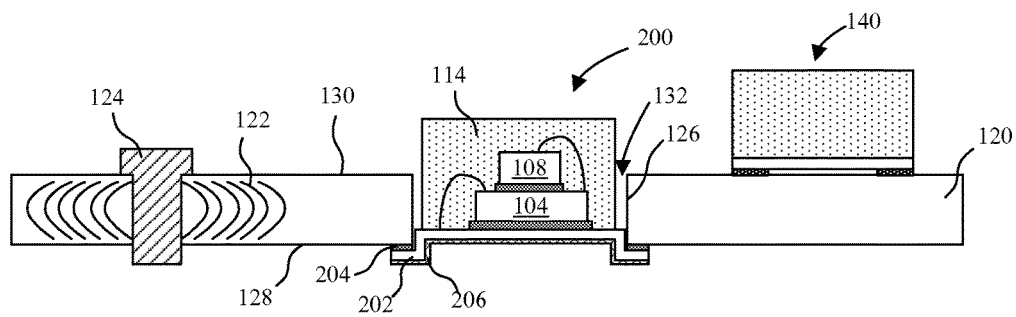
FIG. 13 is a cross-sectional side view illustration of mounting a MEMS package in an opening of a module board in accordance with an embodiment.
Figure 14:
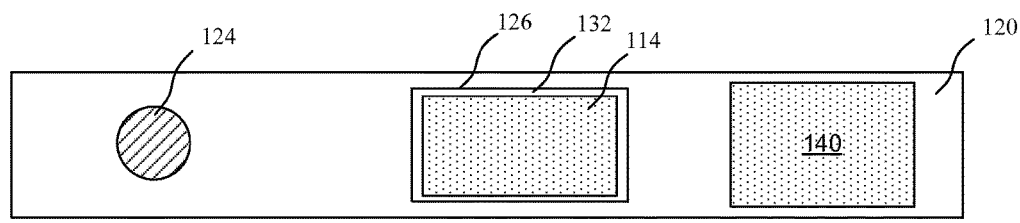
FIG. 14 is a schematic top view illustration of a module board including a screw and MEMS package mounted in an opening of the module board in accordance with an embodiment.

Referring now to FIG. 10 in combination with FIGS. 11-14 a second level package flow is provided in accordance with an embodiment. At operation 1010 a module board 120 is fabricated with one or more openings 126, as illustrated in FIG. 11. At operation 1020 a z-axis film 204 may be attached to the module board 120 adjacent the one or more openings 126 as illustrated in FIG. 12. Alternatively, the z-axis film 204 may attached to the flexible wiring board 202 rather than the module board 120. At operation 1030 a flexible MEMS package 200 is laminated in an opening 126 in the module board 120 as illustrated in FIG. 13. In an embodiment, the flexible MEMS package 200 is laminated in the opening 126 after other packages 140 have been mounted on the module board 120. FIG. 14 is a schematic top view illustration of a module board including a screw 124 and MEMS package 200 mounted in an opening 126 in the module board in accordance with an embodiment. As shown, an air gap 132 is formed around a periphery of the overmold 114 inside the opening 126.

Figure 15:
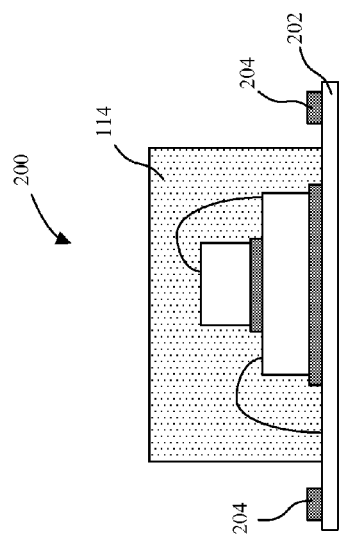
FIG. 15 is a cross-sectional side view illustration of a MEMS package including a flexible wiring board and a z-axis film in accordance with an embodiment.
Figure 16:
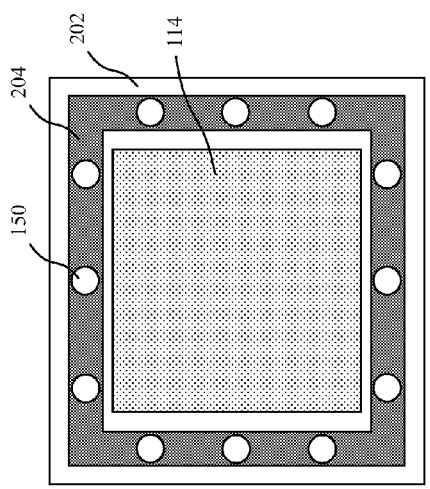
FIGS. 16-17 are schematic top view illustrations of a interconnections between a module board and a MEMS package including a flexible wiring board and a z-axis film in accordance with embodiments.
Figure 17:
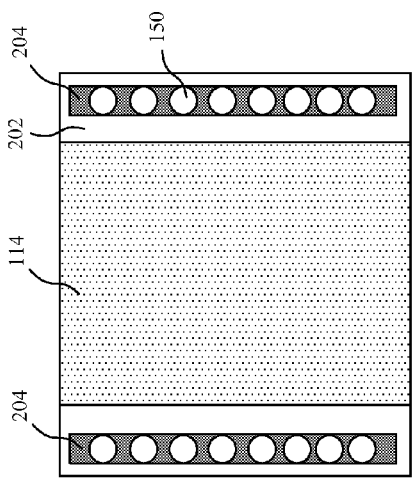

As described above, z-axis film 204 may be applied to either the module board 120 or the flexible wiring board 202 for laminating the flexible MEMS package 200 onto the module board 120. FIG. 15 is a cross-sectional side view illustration of a MEMS package 200 including a flexible wiring board 202 and a z-axis film 204 in accordance with an embodiment. FIGS. 16-17 is a schematic top view illustrations of a interconnections between a module board and a MEMS package including a flexible wiring board and a z-axis film in accordance with embodiments. In accordance with embodiments, the module board 120 may include a plurality of contact pads 150 for making electrical contact with the flexible wiring board 202. In the embodiment illustrated in FIG. 16, an arrangement of contact pads 150 is formed around the opening 126. In such an embodiment, the z-axis film 204 can surround the overmold 114, for example, in the shape of a ring (which may be rectangular). In the embodiment illustrated in FIG. 17, an arrangement of contact pads 150 is formed on opposite sides of the opening 126. In such an embodiment, the z-axis film 204 can be formed as two strips on opposite sides of the overmold 114.

In utilizing the various aspects of the embodiments, it would become apparent to one skilled in the art that combinations or variations of the above embodiments are possible for forming a MEMS module with a MEMS package mounted in an opening of a module board. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A module comprising:
a module board;
an opening extending through and laterally surrounded by the module board;
a package within the opening, wherein the package comprises:
a flexible wiring board mounted on a back surface of the module board and spanning across the opening; and
a micro-electro-mechanical systems (MEMS) die mounted on the flexible wiring board, wherein the MEMS die is encapsulated within an overmold and an air gap exists laterally between the overmold and side surfaces of the opening in the module board.

2. The module of claim 1, further comprising a stiffener layer bonded to a back side of the flexible wiring board opposite the MEMS die.

3. The module of claim 2, wherein the stiffener layer is more flexible than the module board.

4. The module of claim 1, wherein the MEMS die is bonded to an underlying substrate with a die attach film including an elastomeric material.

5. The module of claim 4, wherein the underlying substrate is an integrated circuit (IC) die.

6. The module of claim 5, wherein the MEMS die is wire bonded to the IC die.

7. The module of claim 6, wherein the IC die is wire bonded to the flexible wiring board.

8. The module of claim 4, wherein the underlying substrate is the flexible wiring board.

9. The module of claim 1, wherein the overmold is formed directly on the flexible wiring board.

10. The module of claim 1, further comprising a stiffener layer bonded to a back side of the flexible wiring board opposite the MEMS die, wherein the stiffener layer is partially contained within the opening.

11. The module of claim 1, further comprising an additional package surface mounted onto a front surface of the module board.

12. The module of claim 11, wherein a profile height of the additional package is raised above a profile height of the package comprising the MEMS die.

13. The module of claim 1, further comprising a second die mounted on the flexible wiring board laterally adjacent the MEMS die.

14. The module of claim 13, wherein the second die and the MEMS die are encapsulated within the overmold.

15. The module of claim 13, further comprising a second overmold, and the second die is encapsulated within the second overmold.

16. The module of claim 1, further comprising a wire bond connected to the MEMS die, wherein the wire bond is encapsulated within the overmold.

17. The module of claim 16, wherein the overmold is formed directly on the flexible wiring board.

18. The module of claim 16, wherein the wire bond connects the MEMS die directly to the flexible wiring board.

19. The module of claim 16, wherein the MEMS die is attached to an IC die, and the wire bond connects the MEMS die to the IC die.

20. The module of claim 19, further comprising a second wire bond that connects the IC die to the flexible wiring board, and the second wire bond is encapsulated within the overmold.

* * * * *